United States Patent
Loibl et al.

(10) Patent No.: US 11,197,382 B2
(45) Date of Patent: Dec. 7, 2021

(54) ELECTRONIC MODULE FOR A TRANSMISSION CONTROL UNIT, AND TRANSMISSION CONTROL UNIT

(71) Applicant: ZF Friedrichshafen AG, Friedrichshafen (DE)

(72) Inventors: Josef Loibl, Bad Abbach (DE); Hermann Josef Robin, Regensburg (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 0 days.

(21) Appl. No.: 16/498,245

(22) PCT Filed: Feb. 6, 2018

(86) PCT No.: PCT/EP2018/052864
§ 371 (c)(1),
(2) Date: Sep. 26, 2019

(87) PCT Pub. No.: WO2018/177632
PCT Pub. Date: Oct. 4, 2018

(65) Prior Publication Data
US 2020/0022274 A1    Jan. 16, 2020

(30) Foreign Application Priority Data

Mar. 28, 2017  (DE) .................. 102017205216 .3

(51) Int. Cl.
*H05K 5/00* (2006.01)
*B60R 16/023* (2006.01)
(Continued)

(52) U.S. Cl.
CPC ....... *H05K 5/0082* (2013.01); *B60R 16/0231* (2013.01); *F16H 61/0251* (2013.01);
(Continued)

(58) Field of Classification Search
None
See application file for complete search history.

(56) References Cited

U.S. PATENT DOCUMENTS

| | | | | |
|---|---|---|---|---|
| 7,749,134 B2* | 7/2010 | Wetzel | ................ | B60R 16/0239 361/749 |
| 8,995,146 B2* | 3/2015 | Brooks | .................. | H05K 3/284 361/760 |
| 2013/0314878 A1* | 11/2013 | Ott | ........................ | H05K 5/062 361/720 |

FOREIGN PATENT DOCUMENTS

| | | |
|---|---|---|
| DE | 10 2014 217 351 A1 | 3/2016 |
| DE | 10 2014 223 835 A1 | 5/2016 |
| DE | 10 2015 205 051 A1 | 9/2016 |

OTHER PUBLICATIONS

International Search Report and Written Opinion of the International Search Authority dated May 16, 2018 in International Application No. PCT/EP2018/052864 (English and German languages) (10 pp.)

* cited by examiner

*Primary Examiner* — Mukundbhai G Patel
(74) *Attorney, Agent, or Firm* — Crowell & Moring LLP

(57) ABSTRACT

An electronic module for a transmission control unit may include a printed circuit board that has an electronic component. The electronic component may be electrically connected to a surface of the printed circuit board at least at one point. At least a portion of the electronic component that includes the at least one point may be covered with a protective coating. The protective coating may include a media-tight protective lacquer. The electronic component may be a semiconductor component contained in a housing.

20 Claims, 2 Drawing Sheets

(51) Int. Cl.
*F16H 61/02* (2006.01)
*H05K 1/02* (2006.01)
*H05K 1/18* (2006.01)
*H05K 5/06* (2006.01)

(52) U.S. Cl.
CPC ......... *H05K 1/0203* (2013.01); *H05K 1/0281* (2013.01); *H05K 1/181* (2013.01); *H05K 5/069* (2013.01); *F16H 2710/22* (2013.01); *H05K 2201/066* (2013.01); *H05K 2201/10522* (2013.01)

ELECTRONIC MODULE FOR A TRANSMISSION CONTROL UNIT, AND TRANSMISSION CONTROL UNIT

RELATED APPLICATIONS

This application is a filing under 35 U.S.C. § 371 of International Patent Application PCT/EP2018/052864, filed Feb. 6, 2018, and claiming priority to German Patent Application 10 2017 205 216.3, filed Mar. 28, 2017. All applications listed in this paragraph are hereby incorporated by reference in their entireties.

TECHNICAL FIELD

The present invention relates to an electronic module for a transmission control unit of a motor vehicle, and a transmission control unit with such an electronic control unit.

BACKGROUND

Electronic control units have become less expensive while still providing the same or an increased range of functions. This requires a further development of the existing solutions or the use of novel concepts. In particular, the connection technology between individual components is of increasing interest, because as miniaturization of the electronic components increases, they become more vulnerable to dirt and vibrations. This is the case in particular in the field of vehicle technology, in which electronic components must also function correctly, with greater reliability, under adverse conditions.

In order to protect circuits and/or the electronic modules in the integrated transmission control units, e.g. against transmission fluid flowing around them, the electronic circuits and/or electronic modules are protected, at least in part, by a protective compound or molding compound.

Such an electronic module is disclosed in DE 10 2015 205 051 A1.

BRIEF DESCRIPTION OF THE DRAWINGS

The invention shall be explained in greater detail in reference to the drawings. Therein.

DETAILED DESCRIPTION

Figure 1:
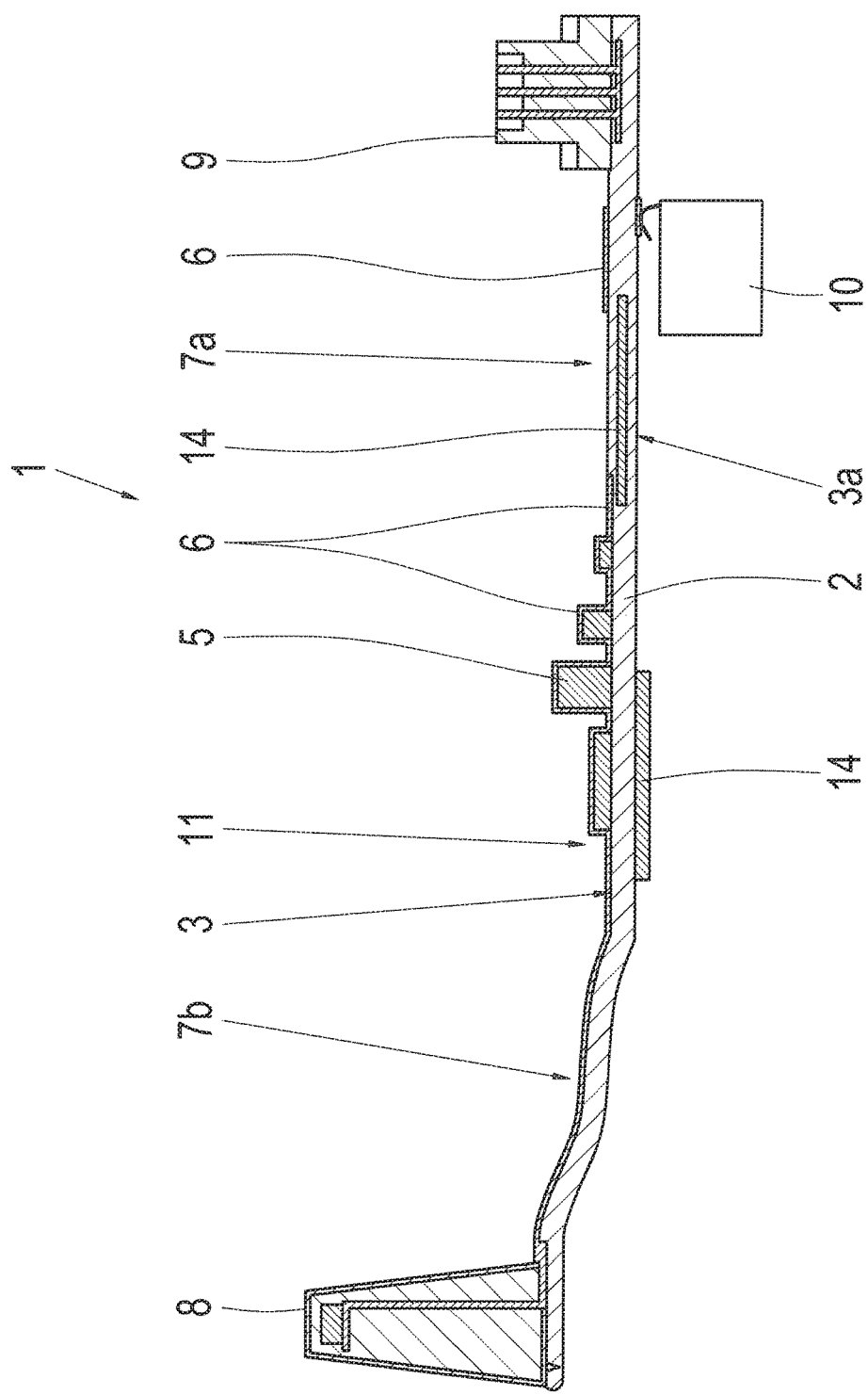
FIG. 1 shows a first exemplary embodiment of an electronic module according to the invention.

The object of the invention is to create an electronic module for a transmission control unit and a transmission control unit that has an electronic module, which has a compact and space-saving construction, and fulfills the requirements for operation when surrounded by transmission fluid.

Embodiments of the present invention advantageously result in a reliable, liquid-tight and inexpensively produced electronic module for a transmission control unit of a motor vehicle, and a transmission control unit that has such an electronic module.

According to a first aspect of the invention, an electronic module for a transmission control unit for a motor vehicle is proposed. The electronic module for a transmission control unit contains a printed circuit board that has an electronic component, which is attached to an upper surface of the printed circuit board and electrically connected thereto. The electronic component and the points where the electronic component is connected to the printed circuit board are covered with a protective coating, wherein the protective coating is a media-tight protective lacquer, and wherein the electronic component is a semiconductor element in a housing.

A housed semiconductor element is understood to be one or more semiconductor chips in a group, which are hermetically sealed in a housing, e.g. a plastic housing, wherein connecting elements, e.g. conductor tracks, extend from the housing. The housed semiconductor elements can be semiconductor elements that have a THT structure (through hole technology) or an SMD structure (surface mounted device) in particular.

The lacquer coating covers the entire surface of the housing for the electronic components exposed to a transmission fluid. The lacquer coating also covers the all of the connecting elements extending from the housing for the electronic elements that are connected to the contact points for the electronic module on the printed circuit board. This ensures that the housed semiconductor element populating the printed circuit board is completely coated with the lacquer coating.

It is possible to obtain an optimal design of an electronic module with the invention regarding the construction and shape thereof. Moreover, this requires fewer parts, and the assembly and production processes are less expensive, resulting in a faster production process. A lacquer coating requires less material than the molding or casting compounds used in the prior art.

With the invention, an analysis can be easily carried out by partially removing the lacquer coating. Moreover, it is easy to connect electronic components, sensor elements, or actuators to the printed circuit board. Further advantages are obtained with regard to an improved thermal connection for cooling the electronic components and the printed circuit board.

The lacquer coating can be cured with light and/or heat. After applying the lacquer coating, it is at least partially cured with a suitable curing means, e.g. UV light, infrared radiation, and/or in a heating oven.

The lacquer coating can be applied through dispensation, spraying, and/or casting. It is also possible to apply the lacquer coating by immersing the printed circuit board in the lacquer. Templates or masks can also be used when applying the lacquer, in order to exclude predefined sections of the printed circuit board from the lacquer coating. These templates or masks can be secured to the printed circuit board prior to applying the lacquer coating, and then removed after the application.

A protective cap, e.g. made of plastic, which is secured to the printed circuit board, can be used to cover the electronic components. The protective cap can be glued or soldered to the printed circuit board, or it can be fastened to the printed circuit board with latches or clips. In particular, the protective cap does not need to be attached to the printed circuit board in a media-tight manner.

In order to reinforce the printed circuit board, a mechanical carrier element can be placed inside the printed circuit board or on a surface of the printed circuit board. This carrier element can be placed on either side of the printed circuit board. In particular, the mechanical carrier element can be placed partially on a surface of the printed circuit board. Lastly, the mechanical carrier element can be placed partially inside the printed circuit board. The carrier element can be at least partially, or entirely, encompassed by the printed circuit board.

The carrier element can be connected to the printed circuit board by means of a thermally conductive adhesive, a thermally conductive paste, or a thermally conductive foil. The carrier element can be an aluminum plate or a plate made of a thermally conductive material.

The printed circuit board can be made partially of rigid and partially of flexible printed circuit board elements. In particular, the printed circuit board can be a multi-layer printed circuit board. The flexible printed circuit board elements can be made of flex foil, or formed by deeply milled regions.

According to a further aspect of the invention, a transmission control unit is proposed for a motor vehicle that has an electronic module. The transmission control unit contains an electronic module according to the first aspect of the invention, and a carrier plate, wherein the printed circuit board of the electronic module is placed on the carrier plate, and wherein the transmission control unit is designed such that it can be exposed to a transmission fluid.

The invention shall be explained in greater detail in reference to the drawings.

FIG. 1 shows a first embodiment of an electronic module according to the invention. The electronic module 1 contains a printed circuit board 2. An upper surface 3 of the printed circuit board 2 is populated with numerous housed electronic components 5. These housed electronic components 5 have connecting elements (not shown). These connecting elements are connected to contact surfaces (not shown) on the upper surface 3 of the printed circuit board. A lacquer coating 6 is applied to part of the upper surface 3 of the printed circuit board 2. This lacquer coating 6 completely covers the housed electronic components 5. In particular, the transition between the housed electronic components 5 and the printed circuit board 2 is covered by the lacquer coating 6. This ensures that a transmission fluid surrounding the electronic module comes in contact with the contact surfaces as well as the housing for the components 5, which could result in damage thereto.

The printed circuit board 2 is a multi-layer printed circuit board. The printed circuit board 2 can contain rigid printed circuit board sections 7a and flexible circuit board sections 7b. These sections 7a, b can likewise be multi-layered. A sensor element 8 can be placed on the flexible section 7b. The sensor element 8 can also be placed on a rigid section of the printed circuit board 2.

Actuators 10, e.g. control valves or plugs 9 can also be placed on the printed circuit board 2, on the lower surface 3a, or the upper surface 3. These components 9, 10 are placed thereon in accordance with the assembly conditions for the electronic module 1.

A carrier element 14 is placed inside the printed circuit board 2 in a rigid section 7a for an exemplary reinforcement of the printed circuit board 2 in a region between two sections that have a lacquer coating 6. This carrier element 14 is encompassed entirely by the printed circuit board 2. The carrier element 14 is made of a thermally conductive material. The connections, e.g. vias leading away from the carrier element 14 on a surface 3, 3a of the printed circuit board, and connected there to a heat sink (not shown), are not shown in the drawing. The carrier element 14 can also be placed elsewhere inside the printed circuit board 2.

In order to reinforce a region beneath the components 5, a carrier element 14 is placed on a lower surface 3a of the printed circuit board 2 lying opposite the components 5. The carrier element 14 is connected to the printed circuit board 2 there by means of a thermally conductive adhesive, a thermally conductive paste, a thermally conductive foil, or a thermally conductive fastener (not shown). The carrier element 14 serves as a heat sink, or a heat sink (not shown) is placed on the carrier element 14.

Figure 2:
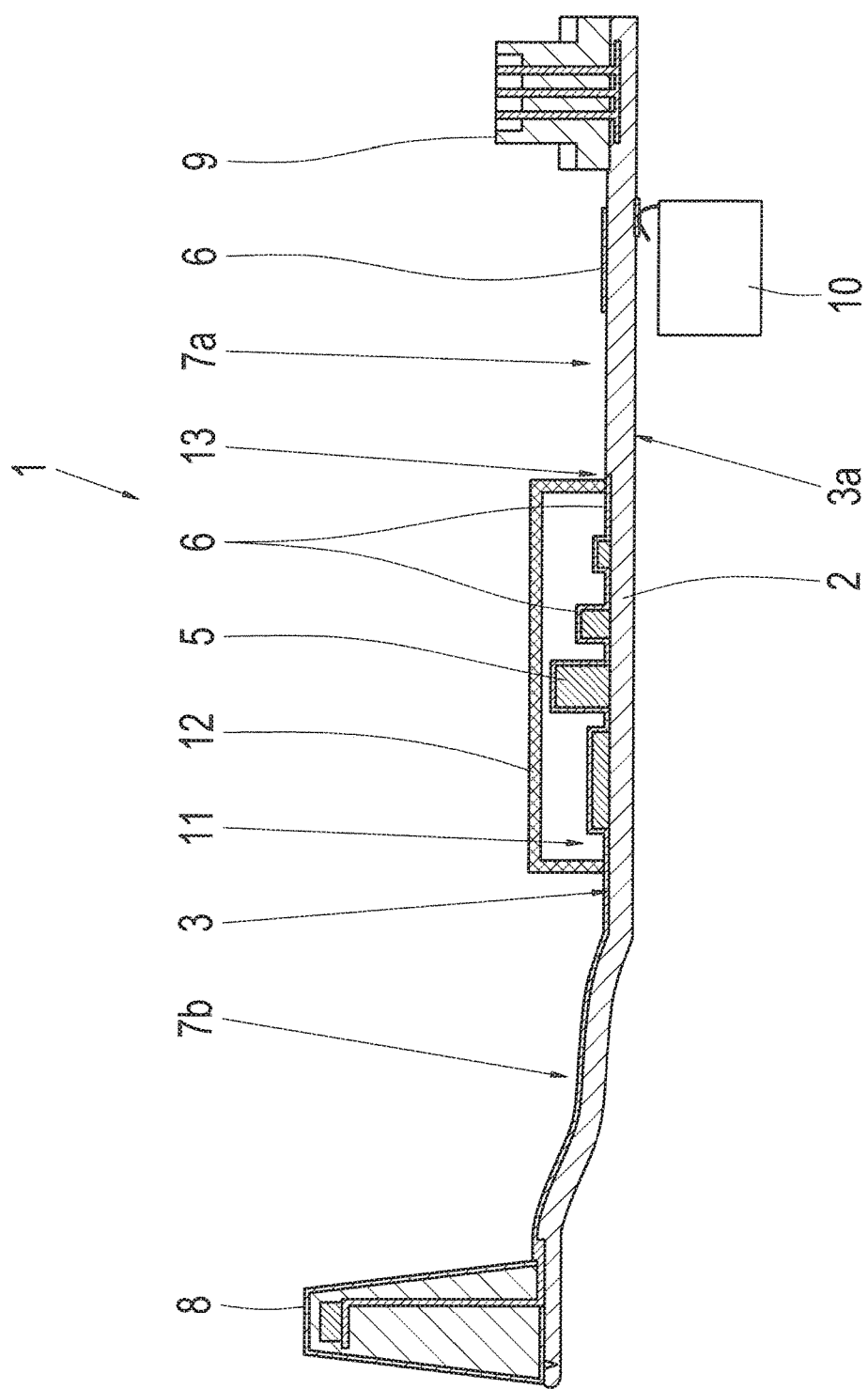
FIG. 2 shows a second exemplary embodiment of an electronic module according to the invention.

FIG. 2 shows a second embodiment of an electronic module according to the invention. A cover 12 is placed on the printed circuit board 2, which serves as a housing for the components 5. This cover 12 can be placed on the lacquer coating 6, or directly on the upper surface 3 of the printed circuit board 2. The cover 12 is glued to the printed circuit board 2, by way of example. The cover 12 can also be fastened to the printed circuit board by means of clips (not show), a latching connection (not shown), or screws (not shown). The cover 12 is not connected in a fluid-tight manner to the printed circuit board 2. The cover 12 substantially provides protection against mechanical effects to the components 5. It is also possible to provide a media-tight seal between the cover 12 and the printed circuit board 2 by means of a suitable sealant.

REFERENCE SYMBOLS 1 electronic module
2 printed circuit board
3a upper surface of the printed circuit board
3a lower surface of the printed circuit board
5 housed electronic components
6 lacquer coating
7a rigid printed circuit board section
7b flexible printed circuit board section
8 sensor
9 plug
10 actuator
11 transition between components and the printed circuit board
12 cover
13 transition between the cover and the printed circuit board/lacquer coating
14 carrier element

The invention claimed is:

1. An electronic module for a transmission control unit, comprising:
   a printed circuit board that has an electronic component,
   wherein the electronic component is electrically connected to a surface of the printed circuit board at least at one point,
   wherein the electronic component and the at least one point are substantially covered with a protective coating,
   wherein the protective coating includes a media-tight protective lacquer,
   wherein the electronic component is a semiconductor component contained in a housing,
   wherein the media-tight protective lacquer is located inside the housing such that the electronic component is protected from transmission fluid that enters a space between a housing cap and the protective coating, and
   wherein the media-tight protective lacquer contacts the housing at least at one transition such that the media-tight protective lacquer is located between the housing and the surface of the printed circuit board.

2. The electronic module according to claim 1, wherein a protective cap covers the portion of the electronic component, and wherein the protective cap is attached to the printed circuit board.

3. The electronic module according to claim 2, wherein the protective cap is glued to the printed circuit board.

4. The electronic module according to claim 2, wherein the attachment of the protective cap to the printed circuit board lacks a media-tight barrier.

5. The electronic module according to claim 2, wherein the protective cap soldered to the printed circuit board.

6. The electronic module according to claim 2, wherein the protective cap is attached to the printed circuit board via at least one of latches or clips.

7. The electronic module according to claim 1, wherein a mechanical carrier element is located at least one of inside the printed circuit board and on the surface of the printed circuit board in order to reinforce the printed circuit board.

8. The electronic module according to claim 7, wherein the carrier element is connected to the printed circuit board with at least one of a thermally conductive adhesive, a thermally conductive paste, a thermally conductive foil, and a thermally conductive fastener.

9. The electronic module according to claim 1, wherein the printed circuit board includes a rigid printed circuit board element and a flexible printed circuit board element.

10. The electronic module according to claim 1, wherein the printed circuit board is a multi-layer printed circuit board.

11. A transmission control unit, comprising:
   a printed circuit board that has an electronic component,
   wherein the electronic component is electrically connected to a surface of the printed circuit board at least at one point,
   wherein the electronic component and the at least one point are substantially covered with a protective coating,
   wherein the protective coating includes a media-tight protective lacquer,
   wherein the electronic component is a semiconductor component contained in a housing, and
   wherein the media-tight protective lacquer is located inside the housing such that the electronic component is protected from transmission fluid that enters a space between a housing cap and the protective coating; and
   a carrier plate,
   wherein the printed circuit board is placed on the carrier plate, and
   wherein the transmission control unit is designed to be exposed to a transmission fluid.

12. The transmission control unit according to claim 11, wherein a protective cap covers the portion of the electronic component, and wherein the protective cap is attached to the printed circuit board.

13. The transmission control unit according to claim 12, wherein the protective cap is at least one of glued and soldered to the printed circuit board.

14. The transmission control unit according to claim 12, wherein the protective cap is attached to the printed circuit board via at least one of latches or clips.

15. The transmission control unit according to claim 12, wherein the attachment of the protective cap to the printed circuit board lacks a media-tight barrier.

16. The transmission control unit according to claim 15, wherein a mechanical carrier element is located at least one of inside the printed circuit board and on the surface of the printed circuit board in order to reinforce the printed circuit board.

17. The transmission control unit according to claim 16, wherein the carrier element is connected to the printed circuit board with at least one of a thermally conductive adhesive, a thermally conductive paste, a thermally conductive foil, and a thermally conductive fastener.

18. The transmission control unit according to claim 11, wherein the printed circuit board includes a rigid printed circuit board element and a flexible printed circuit board element.

19. The transmission control unit according to claim 11, wherein the printed circuit board is a multi-layer printed circuit board.

20. The transmission control unit according to claim 11, wherein the media-tight protective lacquer contacts the housing at least at one transition such that the media-tight protective lacquer is located between the housing and the surface of the printed circuit board.

* * * * *